US012464650B2

(12) United States Patent
Zhu et al.

(10) Patent No.: US 12,464,650 B2
(45) Date of Patent: Nov. 4, 2025

(54) METHOD AND SYSTEM FOR MANUFACTURING FLEXIBLE TRANSPARENT CONDUCTIVE FILM WITH EMBEDDED METAL MATERIAL

(71) Applicants: QINGDAO UNIVERSITY OF TECHNOLOGY, Shandong (CN); QINGDAO 5D INTELLIGENT ADDITIVE MANUFACTURING TECH, Shandong (CN)

(72) Inventors: Xiaoyang Zhu, Qingdao (CN); Ximeng Qi, Qingdao (CN); Hongbo Lan, Qingdao (CN); Hongke Li, Qingdao (CN); Zhenghao Li, Qingdao (CN); Quan Xu, Qingdao (CN); Jiawei Zhao, Qingdao (CN)

(73) Assignees: QINGDAO UNIVERSITY OF TECHNOLOGY, Shandong (CN); QINGDAO 5D INTELLIGENT ADDITIVE MANUFACTURING TECHNOLOGY CO., LTD., Shandong (CN)

(*) Notice: Subject to any disclaimer, the term of this patent is extended or adjusted under 35 U.S.C. 154(b) by 41 days.

(21) Appl. No.: 17/640,371

(22) PCT Filed: Dec. 24, 2020

(86) PCT No.: PCT/CN2020/138898
§ 371 (c)(1),
(2) Date: Mar. 4, 2022

(87) PCT Pub. No.: WO2022/110423
PCT Pub. Date: Jun. 2, 2022

(65) Prior Publication Data
US 2023/0345641 A1    Oct. 26, 2023

(30) Foreign Application Priority Data
Nov. 26, 2020   (CN) .......................... 202011354856.0

(51) Int. Cl.
*H05K 3/10*     (2006.01)
*B33Y 10/00*    (2015.01)
(Continued)

(52) U.S. Cl.
CPC .............. *H05K 3/108* (2013.01); *B33Y 10/00* (2014.12); *B33Y 30/00* (2014.12); *H05K 1/0274* (2013.01); *H05K 1/028* (2013.01)

(58) Field of Classification Search
CPC ........... H05K 3/108; H05K 2201/0108; H05K 2201/09681; B33Y 10/00; B33Y 30/00; H01B 13/0026
See application file for complete search history.

(56) References Cited

U.S. PATENT DOCUMENTS 4,748,043 A * 5/1988 Seaver ................... B05B 5/002
                                                        427/482
5,223,226 A * 6/1993 Wittmer ............... B05B 5/0255
                                                        250/281
(Continued)

FOREIGN PATENT DOCUMENTS

CN      101589473 A  * 11/2009  ............ B22F 1/0022
CN      104050160 A     9/2014
(Continued)

OTHER PUBLICATIONS

Translation of CN 107053653 (Year: 2018).*
Translation of CN 109041563 (Year: 2018).*
International Search Report for PCT/CN2020/138898.

*Primary Examiner* — Jeffrey T Carley
(74) *Attorney, Agent, or Firm* — Jerold I. Schneider; SCHNEIDER IP LAW

(57) ABSTRACT

The present disclosure provides a method and a system for manufacturing a flexible transparent conductive film with an embedded metal material. The method comprises the steps of sequentially printing metal nanowire grids and metal grids with a large aspect ratio on a printing substrate through an electric field driven micro-nano 3D printing method, and forming a composite conductive electrode of the metal grids and the metal nanowire grids; performing conductive treatment on the composite conductive electrode to obtain an electrode material; and embedding the electrode material into a photoresist, separating the photoresist embedded with the electrode material from the printing substrate, and removing the printing substrate to obtain a conductive film, wherein the metal nanowire grids are formed by printing the (Continued)

metal nanowires, and the metal grids with a large aspect ratio are formed by printing nano metal paste.

5 Claims, 7 Drawing Sheets

(51) Int. Cl.
  *B33Y 30/00* (2015.01)
  *H05K 1/02* (2006.01)

(56) References Cited

U.S. PATENT DOCUMENTS

| | | | | |
|---|---|---|---|---|
| 5,504,327 | A | * | 4/1996 | Sproch ............... H01J 49/049 250/281 |
| 8,166,649 | B2 | * | 5/2012 | Moore ................. H01J 17/04 29/850 |
| 11,541,595 | B1 | * | 1/2023 | Busbee ............... B33Y 70/00 |
| 11,551,833 | B2 | * | 1/2023 | Lan .................. H01B 13/0026 |
| 2008/0013299 | A1 | * | 1/2008 | Renn ...................... B41J 2/04 361/818 |
| 2008/0157235 | A1 | * | 7/2008 | Rogers ............... H01L 21/8258 257/415 |
| 2015/0197063 | A1 | * | 7/2015 | Shinar .................. G06F 30/39 700/98 |
| 2015/0216057 | A1 | * | 7/2015 | Park .................... H05K 3/207 174/255 |
| 2019/0334055 | A1 | * | 10/2019 | Chan ..................... C23C 4/06 |

FOREIGN PATENT DOCUMENTS

| | | | | |
|---|---|---|---|---|
| CN | 105336342 | A | | 2/2016 |
| CN | 107053653 | A * | 8/2017 | ........... B29C 64/112 |
| CN | 107086040 | A | | 8/2017 |
| CN | 107544726 | A | | 1/2018 |
| CN | 108885515 | A * | 11/2018 | ............. G06F 3/044 |
| CN | 109041563 | A * | 12/2018 | ............ B22F 3/1103 |
| CN | 110211571 | A | | 9/2019 |
| CN | 110556127 | A | | 12/2019 |
| JP | 2000222406 | A | | 8/2000 |
| WO | WO-2015156877 | A2 * | 10/2015 | ............. B29C 48/02 |

* cited by examiner

METHOD AND SYSTEM FOR MANUFACTURING FLEXIBLE TRANSPARENT CONDUCTIVE FILM WITH EMBEDDED METAL MATERIAL

TECHNICAL FIELD

The present disclosure belongs to the technical field of flexible transparent conductive films and relates to a method and a system for manufacturing a flexible transparent conductive film with an embedded metal material.

BACKGROUND ART

The information disclosed in the background art is only for enhancement of understanding of the general background of the present disclosure, and is not regarded as admitting or suggesting in any form that the information forms the prior art that is already known to those skilled in the art.

The transparent conductive film is a film with high transparency and conductivity in a visible light range, and has a very wide application prospect in the fields of flexible displayers, flexible illumination, flexible solar cells, flexible sensors, flexible transparent electric heating and electromagnetic shielding, flexible transparent robots, transparent wearable devices and the like. At present, the most widely applied transparent conductive film material is a metal oxide (representative is indium tin oxide (ITO)), but the further wide application of the ITO on flexible electronic devices is limited by the factors such as inherent brittleness of ITO, less indium reserves and vacuum manufacturing conditions. Therefore, there is an urgent need in academia and industry to develop flexible transparent conductive films which can replace ITO.

Good photoelectric properties and superior flexibility are two basic elements of flexible transparent conductive films. At present, flexible transparent film materials mainly comprise film metal, graphene, carbon nanotubes, conductive polymers, random metal nanowire networks, ordered metal grids, hybrid materials and the like. However, the film metal flexible transparent conductive film is complex in manufacturing process, most of the film metal flexible transparent conductive films need vacuum evaporation and other processes, the flexible transparent conductive films based on graphene, carbon nanotubes, conductive polymers and other materials have excellent flexibility, but the conductivity of the films is still obviously insufficient compared with that of ITO, and the films are still difficult to replace ITO at present. The random metal nanowire network and the ordered metal grids are regarded as flexible transparent conductive film materials with wide engineering application prospects. The metal nanowire film has high conductivity and transparency (the sheet resistance can reach 10 $\Omega$/sq, and the light transmittance can reach 90%) and excellent flexibility (the bending fatigue characteristic is good, the change rate of the sheet resistance is smaller than 5% after 100 thousand times of bending), and the metal nanowire film is considered to be a next-generation flexible transparent conductive film with great potential. However, the existing metal nanowire flexible transparent conductive film has extremely prominent problems, and a random metal nanowire network has the problems of non-uniform square resistance, large haze, large surface roughness, large nanowire node resistance, poor adhesion between nanowires and an adhesion substrate, poor high temperature resistance and the like. Compared with metal nanowires, the flexible transparent conductive film with ordered metal grid has the advantages of superior photoelectric performance (the sheet resistance can reach 1 $\Omega$/sq, and the light transmittance can reach 90%), low haze and the like, but most of the ordered metal grids float on the surfaces of flexible bases and have high surface roughness, the bending fatigue performance is poorer than that of the metal nanowires, and the adhesion of the metal grids to the bases is still not ideal. Although, in recent years, the academia and the industry propose that the metal grids are embedded into the flexible bases to form the flexible transparent conductive film so that the problems of poor adhesion between the metal grids and the bases, large surface roughness, poor bending fatigue and the like are solved. Due to the embedded inherent attribute of the metal grids, the surface roughness of the flexible transparent conductive film embedded metal grid and the adhesive force between the metal grids and a base material are greatly improved. However, the inventor discovers that the current mainstream embedded metal grid manufacturing processes are composite manufacturing processes based on photoetching, electroplating, laser direct writing, nanoimprint, intaglio printing and other processes. Processes such as a yellow light process and electroplating are difficult to get rid of, the process is tedious, the cost is high, and the environment is not friendly. In addition, embedded metal grids still have difficulty in achieving bending fatigue life comparable to that of metal nanowires.

SUMMARY

In order to overcome the defects in the prior art, the present disclosure aims to provide a method and a system for manufacturing a large-area and high-performance flexible transparent conductive film with an embedded metal material. The method has the advantages of low production cost, simple process, high efficiency, environmental friendliness and the like, and is suitable for various rigid and flexible substrates. Particularly, the flexible transparent conductive film prepared by the present disclosure has excellent photoelectric performance, excellent surface roughness, excellent bending fatigue characteristic and excellent chemical erosion resistance.

Efficient and low-cost manufacturing of a microstructure with large area and large aspect ratio is achieved through an electric field driven micro 3D printing technology, and the technology realizes micro-jetting deposition molding through the electrostatic induction and electrohydrodynamic principle. The principle is that a positive electrode of a high-voltage power supply is connected with a conductive nozzle, a self-excitation electrostatic field is formed, and a printing material is formed into a Taylor cone at the nozzle by utilizing an electrohydrodynamic jet effect, so that the printing precision is improved; and in combination with a charge-induced self-alignment effect, accurate alignment and layer-by-layer heightening are realized, and accurate printing of a structure with a large aspect ratio is easy to realize, so that the mechanical performance and the photoelectric performance of the manufactured flexible transparent conductive film are improved. Further research finds that the resolution ratio of metal nanowire grids and metal grids prepared by existing electric field driven micro-nano 3D printing is low, and the mechanical performance and the photoelectric performance of the embedded metal material conductive film are difficult to improve at the same time.

To achieve the purpose, the present disclosure provides the following technical scheme:

On one hand, the present disclosure provides a printing needle used for electric field driven micro-nano 3D printing, comprising a metal needle and an insulating tube, wherein the insulating tube sleeves the outside of the metal needle, the central axis of the metal needle and the central axis of the insulating tube are located on the same straight line, an outlet of the insulating tube is of a necking structure, and the inner diameter of the outlet of the necking structure is less than that of the metal needle. When the printing needle performs electric field driven micro-nano 3D printing, it can be guaranteed that the electric field intensity at an outlet of the printing needle is stable and concentrated towards the central axis. Meanwhile, the electric field intensity of the printing needle changes more rapidly from the outlet to a substrate, that is, an electrostatic field is more concentrated, and therefore the electrostatic focusing effect is achieved in the printing process. The resolution ratio during printing of the metal nanowire grids and the metal grids can be improved, and manufacturing of the metal grids with a large aspect ratio is achieved through layer-by-layer printing, so that the mechanical performance and the photoelectric performance of the embedded metal material conductive film are improved.

On the other hand, the present disclosure provides a method for manufacturing a flexible transparent conductive film with an embedded metal material. The method comprises the steps of sequentially printing metal nanowire grids and metal grids with a large aspect ratio on a printing substrate through an electric field driven micro-nano 3D printing method, and forming a composite conductive electrode of the metal grids and the metal nanowire grids; performing conductive treatment on the composite conductive electrode to obtain an electrode material; and embedding the electrode material into a photoresist, separating the photoresist embedded with the electrode material from the printing substrate after solidification, and removing the printing substrate to obtain a conductive film, wherein the metal nanowire grids are formed by printing the metal nanowires, the metal grids with a large aspect ratio are formed by printing nano metal paste, and the large aspect ratio is that the ratio range of the wire heights to the wire widths of the grid wires of the metal grids is 0.3-30; and the printing needle in the electric field driven micro-nano 3D printing method is the printing needle according to claim 1 or 2. The scheme gets rid of the limitation of processes such as yellow light manufacture procedure and electroplating, the process is simple, green and environment-friendly and easy to implement, and the flexible transparent conductive film with excellent photoelectric performance and mechanical performance can be efficiently and continuously manufactured at low cost.

On the third aspect, the present disclosure provides a system for manufacturing a flexible transparent conductive film with an embedded metal material, comprising a printing base circulation module, a metal nanowire grid and metal grid printing module, a conductive treatment module, a photosensitive resin laying module, an curing and separation demolding module, a protective film covering module and a printing base tensioning module, wherein the printing base module sequentially penetrates through the metal nanowire grid and metal grid printing module, the conductive treatment module, the curing and separation demolding module and the printing base tensioning module to form a closed-loop system; the metal nanowire grid and metal grid printing module and the conductive treatment module are horizontally arranged in sequence, and the curing and separation demolding module is arranged below the metal nanowire grid and metal grid printing module and the conductive treatment module; the photosensitive resin laying module is located on one side of the curing and separation demolding module, and the two modules are located in the same horizontal direction; the protective film covering module is located on the downstream side of the curing and separation demolding module; and printing needles of electric field driven micro-nano 3D printing devices used for the metal nanowire grid and metal grid printing module are the printing needles.

Through the modules, the flexible transparent conductive film with an embedded metal material can be simply and efficiently manufactured.

Specifically, the printing base circulation module comprises a printing base and a power supporting assembly, the printing base is of an electrodeless annular belt-shaped structure, and the printing base is matched with the power supporting assembly, so that the printing base performs annular circulation operation;

the metal nanowire grid and metal grid printing module, the conductive treatment module, the curing and separation demolding module and the printing base tensioning module are sequentially arranged in the operation direction of the printing base; the photosensitive resin laying module, the curing and separation demolding module and the protective film covering module are sequentially arranged in the operation direction of the transfer base;

the metal nanowire grid and metal grid printing module is sequentially composed of a metal nanowire grid printing device and a metal grid printing device in the operation direction of the printing base, a printing needle of the metal nanowire grid printing device and a printing needle of the metal grid printing device are both matched with the printing base, and the metal nanowire grid printing device and the metal grid printing device are electric field driven micro-nano 3D printing devices;

the conductive treatment module is a heating curing device, and the printing base operates in a heating cavity of the heating curing device;

the curing and separation demolding module is provided with a lifting roller device, a supporting roller assembly and an ultraviolet curing device, the lifting roller device is matched with the supporting roller assembly so that the printing base is matched with the transfer base, and the flexible transparent conductive film with an embedded metal material is formed on the surface of the transfer base;

the printing base tensioning module comprises a tension adjusting roller, and the tension adjusting roller is used for adjusting the tension of the printing base;

the photosensitive resin laying module comprises a transfer base unwinding roller and a glue dispensing device, the transfer base unwinding roller is used for conveying the transfer base, and the glue dispensing device is used for adding photosensitive resin to the transfer base; and the protective film covering module comprises a protective film unwinding roller, a back roller assembly and a winding roller, the protective film unwinding roller is used for conveying a protective film, and the back roller assembly is used for covering the surface of the flexible transparent conductive film with an embedded metal material with the protective film, and the winding roller is used for collecting the flexible transparent conductive film with an embedded metal material covered with the protective film.

The present disclosure has the following beneficial effects:

Firstly, by utilizing an electric field driven micro-nano 3D printing technology, the technology can realize high-efficiency and low-cost manufacturing of a large-area microstructure, can print a high-viscosity material, and is high in adaptability to the viscosity of the material; the technology also solves the problem that stable printing is difficult to realize due to discharge and short circuit phenomena in the printing process because of the existence of residual charges in the traditional electrohydrodynamic jet printing technology; in addition, the technology not only can realize single-step direct graphical printing of the metal girds, but also has the outstanding advantages of high material utilization rate, low production cost and large-area and high-resolution graphics, and has the characteristics of no generation of waste liquid and waste and green manufacturing; and a brand new solution is provided for efficient, low-cost and green manufacturing of the embedded metal material flexible transparent conductive film.

Secondly, the present disclosure innovatively provides a combined printing needle, comprising a metal needle and an insulating tube, wherein the insulating tube sleeves the outside of the metal needle, the central axis of the metal needle and the central axis of the insulating tube are located on the same straight line, an outlet of the insulating tube is of a necking structure, and the inner diameter of the outlet of the necking structure is less than that of the metal needle. When the printing needle performs electric field driven micro-nano 3D printing, it can be guaranteed that the electric field intensity at an outlet of the printing needle is stable and concentrated towards the central axis. Meanwhile, the electric field intensity of the printing needle changes more rapidly from the outlet to a substrate, that is, an electrostatic field is more concentrated, and therefore the electrostatic focusing effect is achieved in the printing process, manufacturing of a metal grid and metal nanowire composite conductive structure with high resolution and large aspect radio is achieved, and manufacturing of the metal grids with a large aspect ratio is achieved through layer-by-layer printing, so that the mechanical performance and the photoelectric performance of the embedded metal material conductive film are improved.

Thirdly, through a roll-to-roll process, integrated manufacturing of embossed electrode printing, embedding and packaging of the flexible transparent conductive film is efficiently and rapidly realized, the production efficiency is improved, all procedures are integrated to the maximum extent, and low-cost, batched and green manufacturing of the large-area and high-performance flexible transparent conductive film is realized.

Fourthly, the advantages of the metal grid and metal nanowire flexible transparent conductive film are fully combined, and the metal grid and metal nanowire are embedded into the flexible transparent material, so that the manufactured large-area flexible transparent conductive film has high photoelectric performance (the light transmittance is greater than 90%, the sheet resistance is less than 0.1 Ω/sq, and the haze is less than 1%), and meanwhile has excellent bending fatigue characteristic (the sheet resistance change rate of 100,000 times of bending is less than 5%), excellent surface roughness (Ra is less than 10 nm) and excellent chemical corrosion resistance and temperature and humidity resistance characteristics.

Fifthly, complex processing technologies such as photo-etching, nanoimprint, vacuum sputtering, electroplating and chemical plating and harsh processing environments are not needed, waste liquid and waste gas are not generated in the production process, environment pollution is avoided, effective utilization of resources is improved, and the production cost is reduced.

Sixthly, the printing substrate is a closed loop and can be recycled, so that the production cost is reduced, and the production efficiency is improved.

BRIEF DESCRIPTION OF THE DRAWINGS

Attached figures of the description which form a part of the present disclosure are used for providing further understanding of the present disclosure, and the illustrative embodiments and description thereof in the present disclosure are used for explaining the present disclosure and are not to be construed as an undue limitation of the present disclosure.

DETAILED DESCRIPTION OF THE EMBODIMENTS

Figure 1:
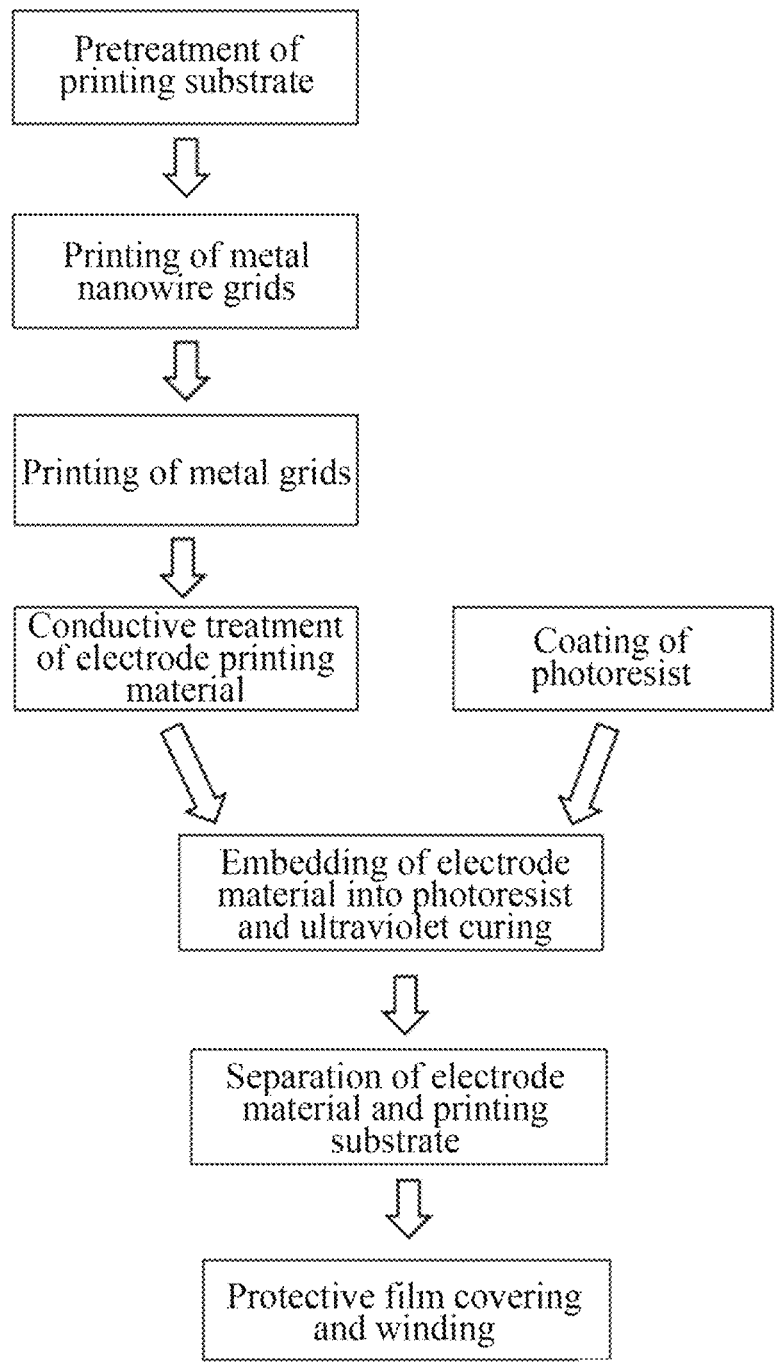
FIG. 1 is a manufacturing process flow diagram of a flexible transparent conductive film provided by the embodiment of the present disclosure.

It should be noted that the following detailed description is exemplary and aims to provide further description for the present disclosure. Except as otherwise noted, all techniques and scientific terms used in the present disclosure have same meanings generally understood by ordinary skill in the art in the present disclosure.

It needs to be noted that the terms used herein just describe the specific mode of execution, but not expect to limit the exemplary modes of execution in the disclosure. It is to be understood that the singular forms "a", "an", and "the" include plural referents unless the context clearly dictates otherwise. Moreover, it should be understood that the terms "contain" and/or "comprise" used in the specification indicate characteristics, steps, operations, devices, assemblies and/or their combination.

In view of the defects that an existing embedded metal grid manufacturing process is complex in process and high in cost, and a conductive film of embedded metal grids is short in bending fatigue life and the like, the present disclosure provides a method and a system for manufacturing a flexible transparent conductive film with an embedded metal material.

In one typical mode of execution of the present disclosure, the present disclosure provides a printing needle used for electric field driven micro-nano 3D printing, comprising a metal needle and an insulating tube, wherein the insulating tube sleeves the outside of the metal needle, the central axis of the metal needle and the central axis of the insulating tube are located on the same straight line, an outlet of the insulating tube is of a necking structure, and the inner diameter of the outlet of the necking structure is smaller than that of the metal needle.

When the printing needle performs electric field driven micro-nano 3D printing, it can be guaranteed that the electric field intensity at an outlet of the printing needle is stable and concentrated towards the central axis. Meanwhile, the electric field intensity of the printing needle changes more rapidly from the outlet to a substrate, that is, an electrostatic field is more concentrated, and therefore the electrostatic focusing effect is achieved in the printing process. The resolution ratio during printing of the metal nanowire grids and the metal grids with a large aspect ratio can be improved, so that the mechanical performance and the photoelectric performance of the embedded metal material conductive film are improved. When the wall thickness of the outlet of the insulating nozzle is reduced and other parameters are kept unchanged (the insulating nozzles such as small-wall-thickness glass nozzles are easier to manufacture), the focusing effect is more remarkable.

In some embodiments of the mode of execution, the insulating tube sleeves a capillary glass needle.

In one or more embodiments, the inner diameter of the capillary glass needle is 20-100 μm.

In another mode of execution of the present disclosure, the present disclosure provides a method for manufacturing a flexible transparent conductive film with an embedded metal material, comprising the steps of sequentially printing metal nanowire grids and metal grids with a large aspect ratio on a printing substrate through an electric field driven micro-nano 3D printing method, and forming a composite conductive electrode of the metal grids and the metal nanowire grids; performing conductive treatment on the composite conductive electrode to obtain an electrode material; and embedding the electrode material into a photoresist, separating the photoresist embedded with the electrode material from the printing substrate, and removing the printing substrate to obtain a conductive film, wherein the metal nanowire grids are formed by printing the metal nanowires, the metal grids with a large aspect ratio are formed by printing nano metal paste, and the large aspect ratio is that the ratio range of the wire heights to the wire widths of the grid wires of the metal grids is 0.3-30; and the printing needle in the electric field driven micro-nano 3D printing method is the printing needle.

In some embodiments of the mode of execution, the printing substrate is a flexible coiled material of which the surface is coated with a material with hydrophobic performance. Through a hydrophobic layer, the electrode material of the printing substrate is easy to separate, and metal grids with a large aspect ratio are easily formed.

In some embodiments of the mode of execution, the printing substrate is dried with nitrogen after being cleaned with deionized water. The cleanness of the surface is ensured.

In some embodiments of the mode of execution, when the metal nanowire grids are printed, layer-by-layer accumulated printing is performed for at least two times.

In some embodiments of the mode of execution, when the metal grids with a large aspect ratio are printed, layer-by-layer accumulated printing is performed for at least two times.

In some embodiments of the mode of execution, during printing, the distance between the printing needle and the printing substrate is 40-200 μm, and the power supply voltage is 800-1700 V.

In some embodiments of the mode of execution, during printing, the printing substrate is fixed in a negative pressure mode.

In some embodiments of the mode of execution, the hydrophobic layer serving as the printing substrate comprises, but not limited to, any one of PDMS, nano coating liquid and the like.

In some embodiments of the mode of execution, the nano-metal wires comprise, but not limited to, nano-silver wires, nano-copper wires and the like.

In some embodiments of the mode of execution, the nano metal paste is micro-nano silver conductive paste, micro-nano copper conductive paste and the like, and the viscosity is 600-80000 cps.

In some embodiments of the mode of execution, the conductive treatment is heating curing.

In some embodiments of the mode of execution, the photoresist is laid on the surface of a transfer base, the electrode material on the surface of the printing substrate is immersed into the photoresist laid on the surface of the transfer base, then the photoresist is solidified, and the solidified photoresist is separated from the printing substrate.

In some embodiments of the mode of execution, the photosensitive resin is cured by ultraviolet irradiation.

In some embodiments of the mode of execution, the adhesive force between the electrode material and the printing substrate is smaller than the adhesive force between the photoresist and the electrode material, and the adhesive force between the photosensitive resin and the printing substrate is smaller than the adhesive force between the photosensitive resin and the transfer base.

In some embodiments of the mode of execution, the photosensitive resin comprises, but not limited to, any of photoresist, Vero, Tango, and the like.

In some embodiments of the mode of execution, the printing base comprises, but not limited to, any of polyimide, polystyrene, polyphenylene oxide, polyethylene terephthalate (PET), polyethylene naphthalate, polyvinyl chloride, polyurethane, epoxy and the like.

In some embodiments of the mode of execution, the transfer base comprises, but not limited to, any of polyimide, polystyrene, polyphenylene oxide, polyethylene terephthalate (PET), polyethylene naphthalate, polyvinyl chloride, polyurethane, epoxy and the like.

In some embodiments of the mode of execution, after the printing substrate is removed, film covering protection is carried out on the surface of the photosensitive resin.

In some embodiments of the mode of execution, a protective film for fill covering protection is a polypropylene film or a polyvinyl chloride film or the like.

In the third mode of execution in the present disclosure, the present disclosure provides a system for manufacturing a flexible transparent conductive film with an embedded metal material, comprising a printing base circulation module, a metal nanowire grid and metal grid printing module, a conductive treatment module, a photosensitive resin laying module, an curing and separation demolding module, a protective film covering module and a printing base tensioning module, wherein the printing base module sequentially penetrates through the metal nanowire grid and metal grid printing module, the conductive treatment module, the curing and separation demolding module and the printing base tensioning module to form a closed-loop system; the metal nanowire grid and metal grid printing module and the conductive treatment module are horizontally arranged in sequence, and the curing and separation demolding module is arranged below the metal nanowire grid and metal grid printing module and the conductive treatment module; the photosensitive resin laying module is located on one side of the curing and separation demolding module, and the two modules are located in the same horizontal direction; the protective film covering module is located on the downstream side of the curing and separation demolding module; and printing needles of electric field driven micro-nano 3D printing devices used for the metal nanowire grid and metal grid printing module are the printing needles.

Through the modules, the flexible transparent conductive film with an embedded metal material can be simply and efficiently manufactured.

The printing base circulation module is used for bearing a layer of hydrophobic printing substrate.

The metal nanowire grid and metal grid printing module is used for printing metal nanowire grids and metal grids on the surface of the hydrophobic layer substrate;

the conductive treatment module is used for performing conductive treatment on the composite conductive electrode;

the photosensitive resin laying module is used for laying photosensitive resin on the transfer base;

the curing and separation demolding module is used for embedding the electrode material into photosensitive resin laid on the transfer base, curing the photosensitive resin embedded with the electrode material, and separating the cured photosensitive resin from the surface of the substrate;

the protective film covering module is used for covering one side of the photosensitive resin embedded with the electrode material with a layer of protective film; and the printing base tensioning module is used for keeping the printing base in a tensioning state all the time, and the printing precision is guaranteed.

In some embodiments of the mode of execution, the printing base circulation module comprises a printing base and a power supporting assembly, the printing base is of an electrodeless annular belt-shaped structure, and the printing base is matched with the power supporting assembly, so that the printing base performs annular circulation operation;

the metal nanowire grid and metal grid printing module, the conductive treatment module, the curing and separation demolding module and the printing base tensioning module are sequentially arranged in the operation direction of the printing base; the photosensitive resin laying module, the curing and separation demolding module and the protective film covering module are sequentially arranged in the operation direction of the transfer base;

the metal nanowire grid and metal grid printing module is sequentially composed of a metal nanowire grid printing device and a metal grid printing device in the operation direction of the printing base, a printing needle of the metal nanowire grid printing device and a printing needle of the metal grid printing device are both matched with the printing base, and the metal nanowire grid printing device and the metal grid printing device are electric field driven micro-nano 3D printing devices;

the conductive treatment module is a heating curing device, and the printing base operates in a heating cavity of the heating curing device;

the curing and separation demolding module is provided with a lifting roller device, a supporting roller assembly and an ultraviolet curing device, the lifting roller device is matched with the supporting roller assembly so that the printing base is matched with the transfer base, and the flexible transparent conductive film with an embedded metal material is formed on the surface of the transfer base;

the printing base tensioning module comprises a tension adjusting roller, and the tension adjusting roller is used for adjusting the tension of the printing base;

the photosensitive resin laying module comprises a transfer base unwinding roller and a glue dispensing device, the transfer base unwinding roller is used for conveying the transfer base, and the glue dispensing device is used for adding photosensitive resin to the transfer base; and the protective film covering module comprises a protective film unwinding roller, a back roller assembly and a winding roller, the protective film unwinding roller is used for conveying a protective film, and the back roller assembly is used for covering the surface of the flexible transparent conductive film with an embedded metal material with the protective film, and the winding roller is used for collecting the flexible transparent conductive film with an embedded metal material covered with the protective film.

In some embodiments of the mode of execution, the conductive treatment module is a heating curing device.

In some embodiments of the mode of execution, the photosensitive resin laying module comprises glue dispenser, a lining roller and an anilox roller, the glue dispenser is used for conveying liquid photosensitive resin to the anilox roller, and the lining roller is matched with the anilox roller. The thickness of the liquid photosensitive resin on the surface of the transfer base is controlled through the cooperation of the lining roller and the anilox roller.

The process of embedding the electrode material into the photosensitive resin by adopting the photosensitive resin laying module and an embedding and photocuring module comprises the following steps: taking a transparent flexible transfer base, and laying a layer of photosensitive resin on the transparent flexible transfer base. The photosensitive resin is stored in the glue dispenser, and the liquid photosensitive resin is output to the transparent flexible transfer base located on the anilox roller. The transparent flexible transfer base is located between the lining roller and the anilox roller, the position of the lining roller is kept unchanged, the discharging speed of the glue dispenser and the relative height of the anilox roller and the lining roller are changed according to the need by means of vertical mutual extrusion of the anilox roller and the lining roller, and the liquid photosensitive resin with a certain thickness can be evenly coated on the transparent flexible transfer base. The printing substrate of the metal grid and metal nanowire composite structure and the flexible transparent transfer base of which the surface is coated with the photosensitive resin enter a transfer station at the same speed. The printing substrate printed with the metal grid and metal nanowire composite structure is located on the transfer base coated with the photosensitive resin, and the metal grid and metal nanowire composite structure is kept opposite to the photosensitive resin. The two bases are supported by a front supporting roller and a rear supporting roller which are parallel and are the same in heights, the two supporting rollers for supporting the transfer base coated with the photosensitive resin are fixed, and the two supporting rollers for supporting the printing substrate with the metal grid and metal nanowire composite structure can move up and down at the same time. The thickness of the photoresist can be further adjusted by adjusting the two supporting rollers. After the electrode material is immersed into the photosensitive resin, the photosensitive resin is cured by an ultraviolet lamp located below the electrode material. Finally, the metal nanowire and metal grid composite conductive electrode material printed on the surface of the hydrophobic layer is embedded into the cured photosensitive resin.

More specifically, the process for manufacturing the flexible transparent conductive film with an embedded metal material by using the system comprises the following specific steps:

Step one, pretreatment of printing substrate:
a flexible coiled material film is used as a printing base film, and a uniform hydrophobic layer is coated on the surface of the flexible coiled material film to serve as a printing substrate; and the substrate is cleaned with deionized water, and then the substrate is dried with nitrogen to ensure the surface cleanness.

Step two, printing of metal nanowire grids:
the treated hydrophobic layer printing substrate is moved to a printing station of the metal nanowire grids; and a large-area metal nanowire grid structure is manufactured on the hydrophobic layer substrate by utilizing electric field driven micro-nano 3D printing.

Step three, preparation of metal grids:
the printed metal nanowire grids are moved to a printing station of the metal grids; a large-area metal grid structure is manufactured on patterns with the metal nanowire grids by utilizing electric field driven micro-nano 3D printing; and the printing needle is a combined needle formed by the metal needle and an insulating tube.

Step four, conductive treatment of a metal grid and metal nanowire grid composite conductive structure:
the printed electrode material is moved to a station of a heating curing device, and conductive treatment is carried out on the metal grid and silver nanowire grid composite conductive structure.

Step five, coating of the photosensitive resin:
the glue dispenser outputs the liquid photosensitive resin to the anilox roller, and the photosensitive resin is uniformly coated on the transfer base.

Step six, transfer of the composite conductive structure:
the printing substrate and the transfer base are attached through a roller-to-roller device, the photosensitive resin is cured through a curing area, the metal grid and metal nanowire grid composite conductive structure is embedded into the photosensitive resin on the transfer base film, and the electrode material embedded into the photosensitive resin is separated from the printing substrate.

Step seven, film covering protection:
the flexible transparent conductive film is moved to a protective film covering station; a layer of high-transparency protective film is attached to the photosensitive resin side; and the two films are attached under the extrusion of the two rollers.

Step eight: winding:
after the film covering is finished, the transparent conductive film coated with the protective film is wound under the action of the winding roller.

In the first step, the printing base is supported by supporting rollers, power rollers, and a tension adjusting roller, and is always kept in a tensioning state in the whole process flow, and printing can be repeated.

In the second step, the printing needle is a combined needle formed by the metal needle and an insulating tube. Multiple times of layer-by-layer accumulated printing is carried out according to set programs and parameters. Metal nanowires are selected as a printing material, and various (square, rhombic, hexagonal, circular and random network) shapes of high-resolution silver nanowire grid structures are printed by means of an electric field driven micro-nano 3D printing technology. A negative pressure pump communicating with a groove of a printing platform is started, so that the printing platform and the printing base film are tightly adsorbed, the stability of the printing substrate is guaranteed, and the printing precision is improved.

In the third step, multiple times of layer-by-layer accumulated printing is carried out according to set programs and parameters. Nano-metal conductive paste is selected as a printing material, various (such as square, rhombic, hexagonal, triangular, various random network structures and the like) shapes of nano-metal grid structures are printed by means of an electric field driven micro-nano 3D printing technology, and then large-area metal grids are manufactured. A negative pressure pump communicating with a groove of a printing platform is started, so that the printing platform and the printing base film are tightly adsorbed, the stability of the printing substrate is guaranteed, and the printing precision is improved.

In the fifth step, the liquid photosensitive resin can be uniformly coated on the flexible transfer base film substrate at a certain thickness by utilizing vertical mutual extrusion of the anilox roller and the lining roller and changing the discharging speed of the glue dispenser.

In the sixth step, the substrate containing the electrode material and the flexible transparent base of which the surface is coated with the photosensitive resin enter a transfer station together at the same speed. The two supporting rollers for supporting the transfer base film are fixed to a rack and can move up and down at the same time. The thickness of the photoresist can be further adjusted by adjusting the two pairs of supporting rollers.

In the sixth step, after the two substrates are attached, the ultraviolet lamp located below the two substrates carries out photosensitive resin curing. Therefore, the electrode material printed on the surface of the hydrophobic layer is embedded into the cured photosensitive resin. Two flexible bases are separated in an uncovering manner after station ultraviolet curing. The electrode material is embedded into the photosensitive resin, the photosensitive resin is attached to the transfer base film, and the two flexible bases are separated, so that the flexible transparent conductive film with an embedded electrode material is obtained.

In the seventh step, a layer of rubber is attached to the surfaces of the two rollers, so that the two rollers are attached tightly and have a certain extrusion force.

Wherein, the printing base circulation module comprises a closed-loop printing substrate formed by a printing base, a printing substrate (hydrophobic layer), a first power roller, a first supporting roller, a second power roller and a third power roller; the metal nanowire grid and metal grid printing module comprises a metal nanowire grid printing device, a first printing platform, a second supporting roller, a metal grid printing device and a second printing platform; the conductive treatment module comprises a heating curing device; the photosensitive resin laying module comprises an anilox roller, a glue dispenser, a second unwinding roller, a lining roller and a transfer base; the curing and separation demolding module comprises a third supporting roller, a fourth supporting roller, a fifth supporting roller, a sixth supporting roller, an ultraviolet lamp and a liftable roller device; the protective film covering module comprises a first unwinding roller, a first back roller, a second back roller, a winding roller and a protective film; and the printing base tensioning module comprises a tension adjusting roller and a seventh supporting roller. Wherein, the first power roller, the second supporting roller and the first supporting roller are located in the same level, and the seventh supporting roller and the third power roller are located in the same level. And the central spindles of all the rollers are parallel to one another.

The printing substrate in the printing base circulation module is powered by the first power roller, the second power roller and the third power roller. The printing base is driven to move through friction force between the rollers and the printing base.

A hydrophobic layer is scraped on the printing base in the printing base circulation module to serve as a printing substrate, wherein the hydrophobic layer film has the effect that the electrode material printed on the surface of the hydrophobic layer film is easy to separate, and metal grids with a large aspect ratio are easy to form.

The metal nanowire grid printing device and the metal grid printing device in the metal nanowire grid and metal grid printing module are both electric field driven micro-nano 3D printing devices, and comprise a high-voltage power supply, a back pressure adjusting module, a feeding module, a storage cylinder, a spray head support, a Y-axis motion module, a Z-axis motion module, an X-axis motion module, a metal printing needle and a capillary glass tube printing needle, wherein the capillary glass tube printing needle sleeves the outside of the metal printing needle to form a metal-insulation coaxial nozzle. The metal printing needle is connected with a positive electrode of the high-voltage power supply. A printing pattern is printed on the surface coated with the cured printing substrate hydrophobic layer. The printing platform is located below the printing device and the printing base, and the upper surface of the platform is attached to the lower surface of the printing base film. And a groove is formed in the surface of the platform, and a through hole formed in the center of the platform is connected with a negative pressure pump. During printing, a pneumatic pump is started to adsorb the printing base, so that the printing base is kept in a static and stable state, and the printing precision is guaranteed. After printing is finished, the pneumatic pump stops working and releases negative pressure in the groove of the platform, and the printed pattern moves to the next station along with the printing substrate.

The conductive treatment module is used for carrying out conductive treatment on the composite conductive electrode, and can be any one of a heating curing device, a laser in-situ sintering device, a photon sintering device and the like.

Photosensitive resin is stored in the glue dispenser in the photosensitive resin laying module, and the liquid photosensitive resin in the glue dispenser is uniformly coated on the transfer base film released by the second unwinding roller at a certain thickness by controlling the glue dispensing speed of the glue dispenser and the pressure between the anilox roller and the lining roller.

the curing and separation demolding module is used for embedding the electrode material into photosensitive resin laid on the transfer base, curing the photosensitive resin embedded with the electrode material, and separating the cured photosensitive resin from the surface of the substrate. Wherein, the liftable roller device comprises a supporting spring, a height adjusting screw button and a rack. Wherein, the distance between the third supporting roller and the fifth supporting roller and the distance between the fourth supporting roller and the sixth supporting roller can be changed by rotating the height adjusting screw button, the relative distance between the printing substrate and the transfer base film is achieved, and then the photosensitive resin with certain thickness and uniformity is obtained. The photosensitive resin is cured by the ultraviolet lamp.

A stress sensor is arranged on the surface of the tension adjusting roller in the printing base tensioning module, and a certain stress parameter is set to automatically adjust the roller to move up and down. Meanwhile, a soft protective layer is attached to the surface of the roller to protect the surface of the printing substrate from being damaged.

The protective film in the protective film covering module is used for covering one side of the photosensitive resin embedded with the electrode material with a layer of protective film. Under the support of the first unwinding roller, the first back roller and the winding roller, the tension of the protective film is controlled by utilizing the rotation difference of two driving rollers of the first unwinding roller and the winding roller. Wherein, the surfaces of the first back roller and the second back roller are coated with a soft protective layer so as to realize that the protective film is tightly attached to the transfer base film, and bubbles are prevented from appearing.

The transfer base in the system is supported by the second unwinding roller, the lining roller, the fifth supporting roller, the sixth supporting roller, the second back roller and the winding roller, and the tension of the film is controlled through the rotation degree difference of the two driving rollers of the second unwinding roller and the winding roller.

For the purpose that those skilled in the art can understand the technical scheme of the present disclosure better, the following further illustrates the present disclosure with the reference to specific embodiments.

Embodiments

Figure 2:
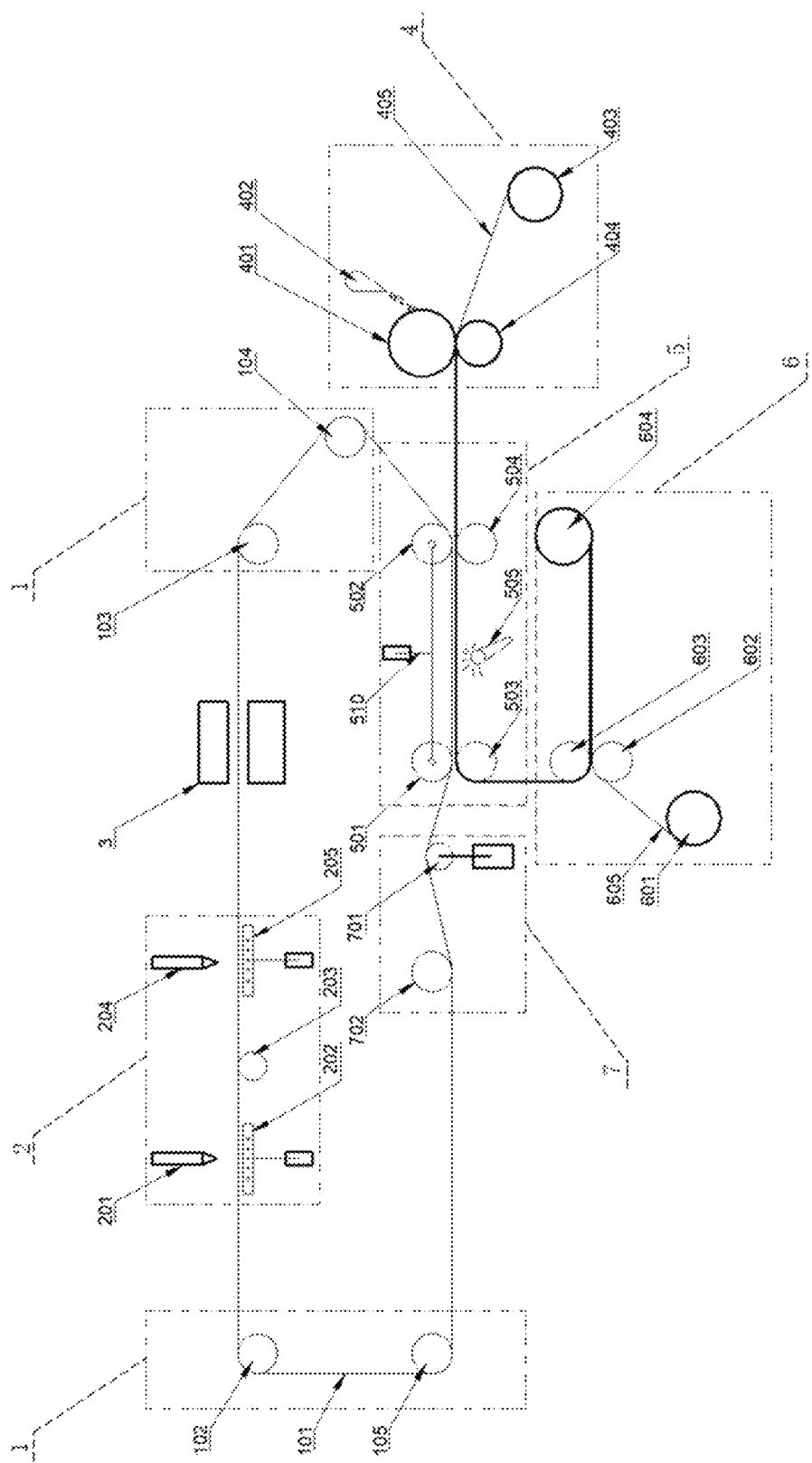
FIG. 2 is a structural schematic diagram of a system for manufacturing a conductive film with an embedded metal material provided by the embodiment of the present disclosure.

A system for manufacturing a flexible transparent conductive film with an embedded metal material, as shown in FIG. 2, comprises the following modules: a printing base circulation module 1, a metal nanowire grid and metal grid printing module 2, a conductive treatment module 3, a photosensitive resin laying module 4, an curing and separation demolding module 5, a protective film covering module 6 and a printing base tensioning module 7.

The printing base circulation module 1 comprises a printing base (PC film) 101, a printing substrate 106 (hydrophobic layer), a first power roller 102, a first supporting roller 103, a second power roller 104 and a third power roller 105. The metal nanowire grid and metal grid printing module 2 comprises a metal nanowire grid printing device 201, a first printing platform 202, a second supporting roller 203, a metal (nano conductive silver paste) grid printing device 204 and a second printing platform 205. The conductive treatment module 3 comprises a heating curing device 3. The photosensitive resin laying module 4 comprises an anilox roller 401, a glue dispenser 402, a second unwinding roller 403, a lining roller 404 and a transfer base (PET film) 405; the curing and separation demolding module 5 comprises a third supporting roller 501, a fourth supporting roller 502, a fifth supporting roller 503, a sixth supporting roller 504, an ultraviolet lamp 505 and a liftable roller device 510; the protective film covering module 6 comprises a first unwinding roller 601, a first back roller 602, a second back roller 603, a winding roller 604 and a protective film PET 605; and the printing base tensioning module 7 comprises a tension adjusting roller 701 and a seventh supporting roller 702. Wherein, the printing substrate PC film 101 is supported by the first power roller 102, the second supporting roller 203, the first supporting roller 103, the second power roller 104, the fourth supporting roller 502, the third supporting roller 501, the supporting roller 702, the tension adjusting roller 701 and the third power roller 105 in the whole process flow to be kept in a tensioning state all the time, and meanwhile, the first power roller 102, the second supporting roller 203 and the first supporting roller 103 are located in the same level, and the seventh supporting roller 702 and the third power roller 105 are located in the same level. A stress sensor is arranged on the surface of the tension adjusting roller 701, and a certain stress parameter is set to automatically adjust the roller to move up and down. Meanwhile, a soft protective layer is attached to the surface of the roller to protect the surface of the printing substrate from being damaged. Wherein, the first power roller 101, the second power roller 103 and the third power roller 105 work synchronously, and the printing substrate is driven to move through friction force between the rollers and the printing substrate.

Figure 3:
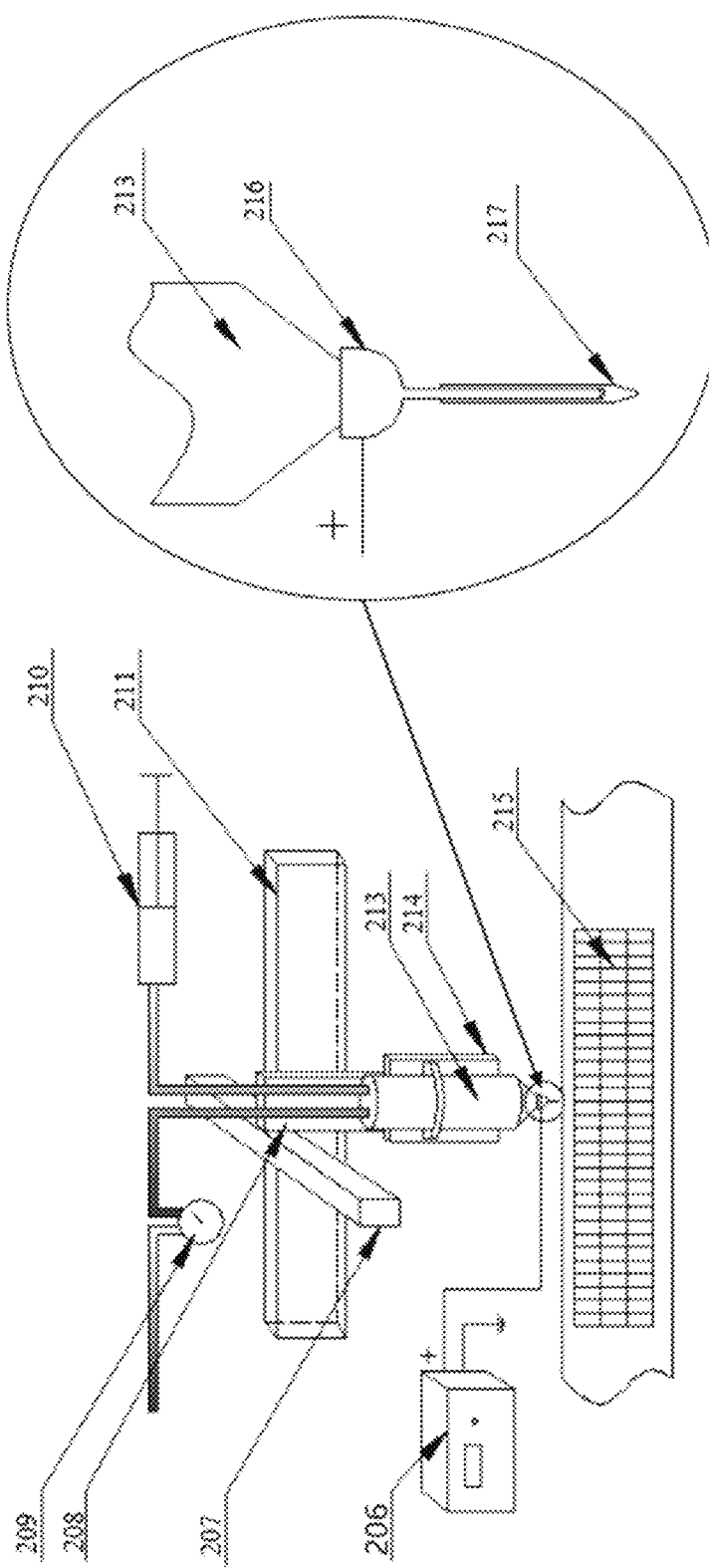
FIG. 3 is a structural schematic diagram of an electric field driven micro-nano 3D printing device provided by the embodiment of the present disclosure.

The metal nanowire grid printing device 201 and the metal grid printing device 204 are both electric field driven micro-nano 3D printing devices, and as shown in FIG. 3, comprise a high-voltage power supply 206, a back pressure adjusting module 209, a feeding module 210, a storage cylinder 213, a spray head support 214, a Y-axis motion module 207, a Z-axis motion module 208, an X-axis motion module 211, a metal printing needle 216 and a capillary glass tube printing needle 217, wherein the capillary glass tube printing needle 217 sleeves the outside of the metal printing needle 216 to form a metal-insulation coaxial nozzle. The metal printing needle 216 is connected with a positive electrode of the high-voltage power supply 206. A printing pattern 215 is printed on the surface coated with the cured printing substrate hydrophobic layer PDMS 106. The printing platform 202/205 is located below the printing device and the printing base 101, and the upper surface of the platform is attached to the lower surface of the printing base film. And a groove is formed in the surface of the platform, and a through hole formed in the center of the platform is connected with a negative pressure pump. During printing, a pneumatic pump is started to adsorb the printing base 101, so that the printing base is kept in a static and stable state, and the printing precision is guaranteed. After printing is finished, the pneumatic pump stops working and releases negative pressure in the groove of the platform, and the printed pattern 215 moves to the next station along with the printing substrate 106.

Figure 4:
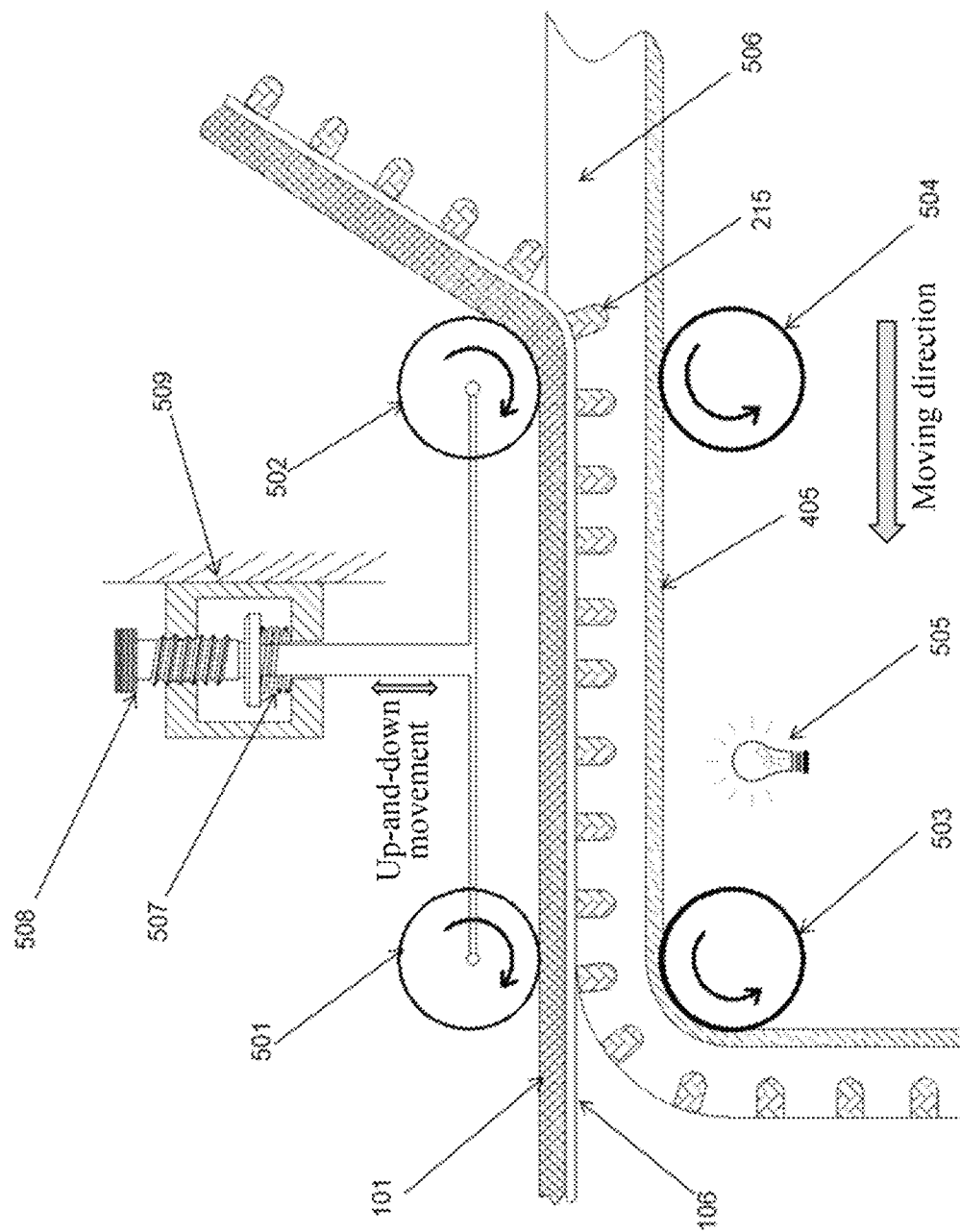
FIG. 4 is a process flow diagram of a flexible transparent conductive film formed by embedding a metal grid and metal nanowire composite conductive structure into photosensitive resin provided by the embodiment of the present disclosure.

The liftable roller device 510, as shown in FIG. 4, comprises a supporting spring 507, a height adjusting screw button 508 and a rack 509. And the coating and curing of the photoresist are realized under the combined action of the third supporting roller 501, the fourth supporting roller 502, the fifth supporting roller 503, the sixth supporting roller 504 and the ultraviolet lamp 505. Wherein, the distance between the third supporting roller 501 and the fifth supporting roller 503 and the distance between the fourth supporting roller 502 and the sixth supporting roller 504 can be changed by rotating the height adjusting screw button 508, and then the relative distance between the printing substrate (PDMS hydrophobic layer) 106 and the transfer base PET film 405 is achieved; the transfer base 405 is supported by the second unwinding roller 403, the lining roller 403, the fifth supporting roller 503, the sixth supporting roller 504, the second back roller 603 and the winding roller 604, and the tension of the film is controlled through the rotation degree difference of the two driving rollers of the second unwinding roller 403 and the winding roller 604; and under the support of the first unwinding roller 601, the first back roller 602 and the winding roller 604, the tension of the protective film PET 605 is controlled by utilizing the rotation difference of two driving rollers of the first unwinding roller 601 and the winding roller 604. Wherein, the surfaces of the first back roller 602 and the second back roller 603 are coated with a soft protective layer so as to realize that the protective film 605 is tightly attached to the transfer base film 405, and bubbles are prevented from occurring. A photoresist coating mechanism comprises an anilox roller 401, a glue dispenser 402 and a lining roller 404, and the liquid photoresist in the glue dispenser 402 is uniformly coated on the film at a certain thickness by controlling the glue dispensing speed of the glue dispenser 402 and the pressure between the anilox roller 401 and the lining roller 404; and the curing thickness of the photoresist is finally determined through the liftable roller device 510 at a subsequent station. Particularly, the central spindles of all the rollers are parallel to one another.

Figure 5:
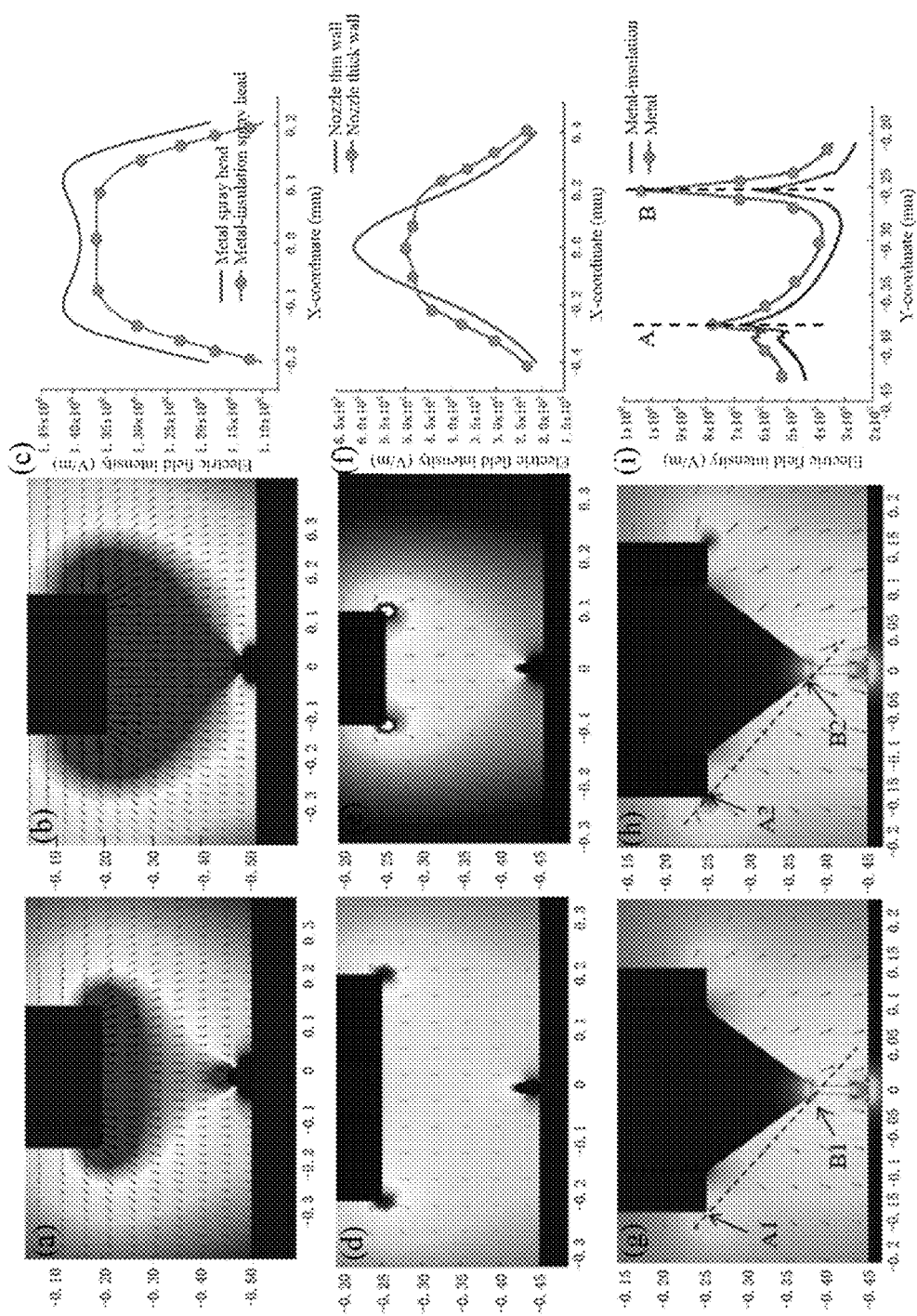
FIG. 5 is a comparison diagram of metal-insulation coaxial spray head and metal spray head self-excitation electrostatic fields, wherein (a) indicates the distribution of a metal-insulation coaxial spray head electrostatic field; (b) indicates the distribution of a metal spray head electrostatic field; (c) indicates the electric field intensity at the position 80 μm below nozzles a and b in the horizontal direction; (d) indicates the distribution of a metal spray head electrostatic field (the wall thickness of a spray head outlet is large); (e) indicates the distribution of a metal spray head electrostatic field (the wall thickness of a spray head outlet is small, and other parameters are the same as those in FIG. d); (f) indicates the electric field intensity at the position 35 μm below nozzles d and e in the horizontal direction; (g) indicates the distribution of an electric field at the top of Taylor cone and the nozzles during metal-insulation coaxial spray head printing; (h) indicates the distribution of an electric field at the top of Taylor cone and the nozzles during metal spray head printing; and (i) indicates the size distribution of an electric field that the top of the Taylor cone is connected with one side of the nozzle during metal-insulation coaxial spray head and metal spray head printing.

The comparison of self-excitation electrostatic fields of a metal-insulation coaxial spray head and a metal printing needle is as shown in FIG. 5, and FIG. 5 shows that the metal-insulation coaxial spray head has an electrostatic focusing effect, the maximum field intensity of the metal printing needle is concentrated near two side walls of the spray head under the condition of the same driving voltage, the distance from the nozzle to the substrate and the outlet size of the spray head, the field intensity at the central axis is low, and the electric field intensity at the nozzle of the metal-insulation coaxial spray head is stable and concentrated towards the central axis. Meanwhile, the electric field intensity of the metal-insulation coaxial spray head changes more rapidly from the nozzle to the glass substrate, which indicates that the electrostatic field of the metal-insulation coaxial spray head is more concentrated. In addition, when the wall thickness of the outlet of the metal nozzle is reduced and other parameters are kept unchanged, the focusing effect is more remarkable. With the prior art and cost, the insulating spray head is easier to manufacture a small-caliber thin wall. When the metal-insulation coaxial spray head and the metal spray head are used for printing, the electric field size distribution diagram of the connecting line of the top end of the Taylor cone and one side of the nozzle can be obtained, the metal nozzle side is much larger than the electric field generated by printing the Taylor cone, the Taylor cone swings in the printing process, and on the contrary, the electric field at the Taylor cone of the glass needle is larger than the electric field generated by the nozzle, so that the printing process is more stable.

A specific process for manufacturing a conductive film with an embedded metal material using the system is shown in FIG. 1. As shown in FIG. 1, the process comprises the following steps:

Step one, pretreatment of printing substrate:
  a flexible coiled material PC film with the thickness of 0.2 mm is used as a printing base film, and a uniform hydrophobic layer is coated on the surface of the flexible coiled material PC film; the substrate is cleaned with deionized water, and then the substrate is dried with nitrogen to ensure the surface cleanness; and the hydrophobic layer film is formed by the PDMS, so that the electrode material printed on the surface of the hydrophobic layer film is easy to separate, and metal grids with a large aspect ratio are easily formed, the PDMS liquid used is Sylgard 184 produced by Dow Corning Company.

Step two, printing of silver nanowire grids:
  the pretreated PDMS printing substrate is moved to a printing station of the silver nanowires; a large-area silver nanowire grid structure is manufactured on the PDMS substrate by utilizing electric field driven micro-nano 3D printing; the printing needle is a combined needle formed by embedding a metal needle into a capillary glass needle tube with a conical nozzle, the inner diameter of the glass needle is smaller than that of metal, and then the resolution of the printed metal grids is improved; multiple times of layer-by-layer accumulated printing is carried out according to set programs and parameters; metal nanowires (the average wire diameter is 30-50 mm, the length-diameter ratio is 1000, and the concentration is 5-30 mg/ml) are selected as a printing material, and various (square, rhombic, hexagonal, circular and random network) shapes of high-resolution silver nanowire grid structures are printed by means of an electric field driven micro-nano 3D printing technology; and a negative pressure pump communicating with a groove of a printing platform 202 is started, so that the printing platform and the printing base PC film are tightly adsorbed, the stability of the printing substrate is guaranteed, and the printing precision is improved, wherein the printing parameters are as follows: the inner diameter of the capillary glass needle is 30-100 μm, the distance between the spray head and the base is 80-150 μm, the printing speed is 10-20 mm/s, the direct current voltage is 800-1000 V, and the printing pressure intensity is 20-60 kpa; and the effective pattern area of the silver nanowire grids is 150 mm*150 mm, the line width is 10-25 μm, and the period is 50-1000 μm.

Figure 6:
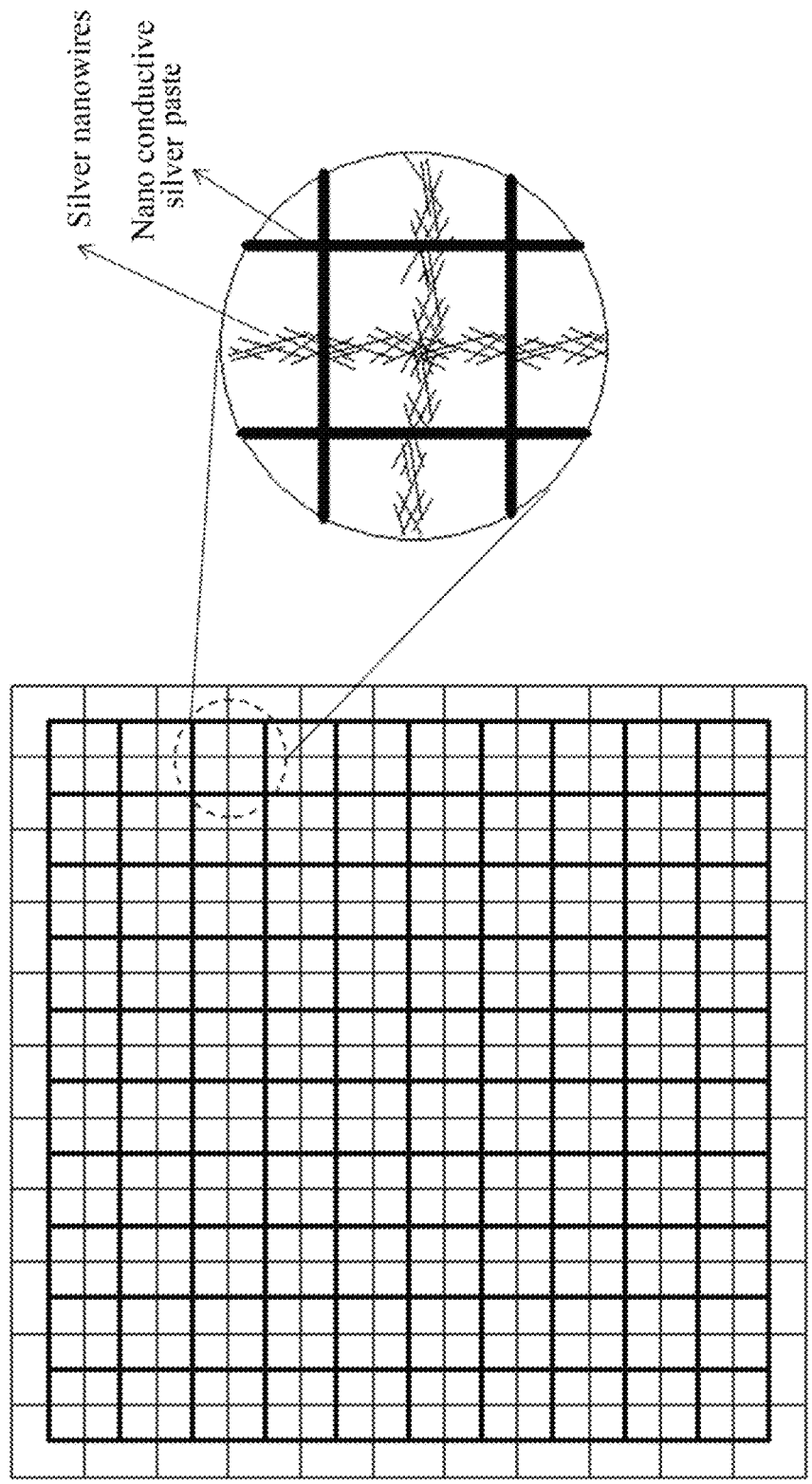
FIG. 6 is a schematic diagram of a square metal grid and square metal nanowire grid composite conductive structure.
Figure 7:
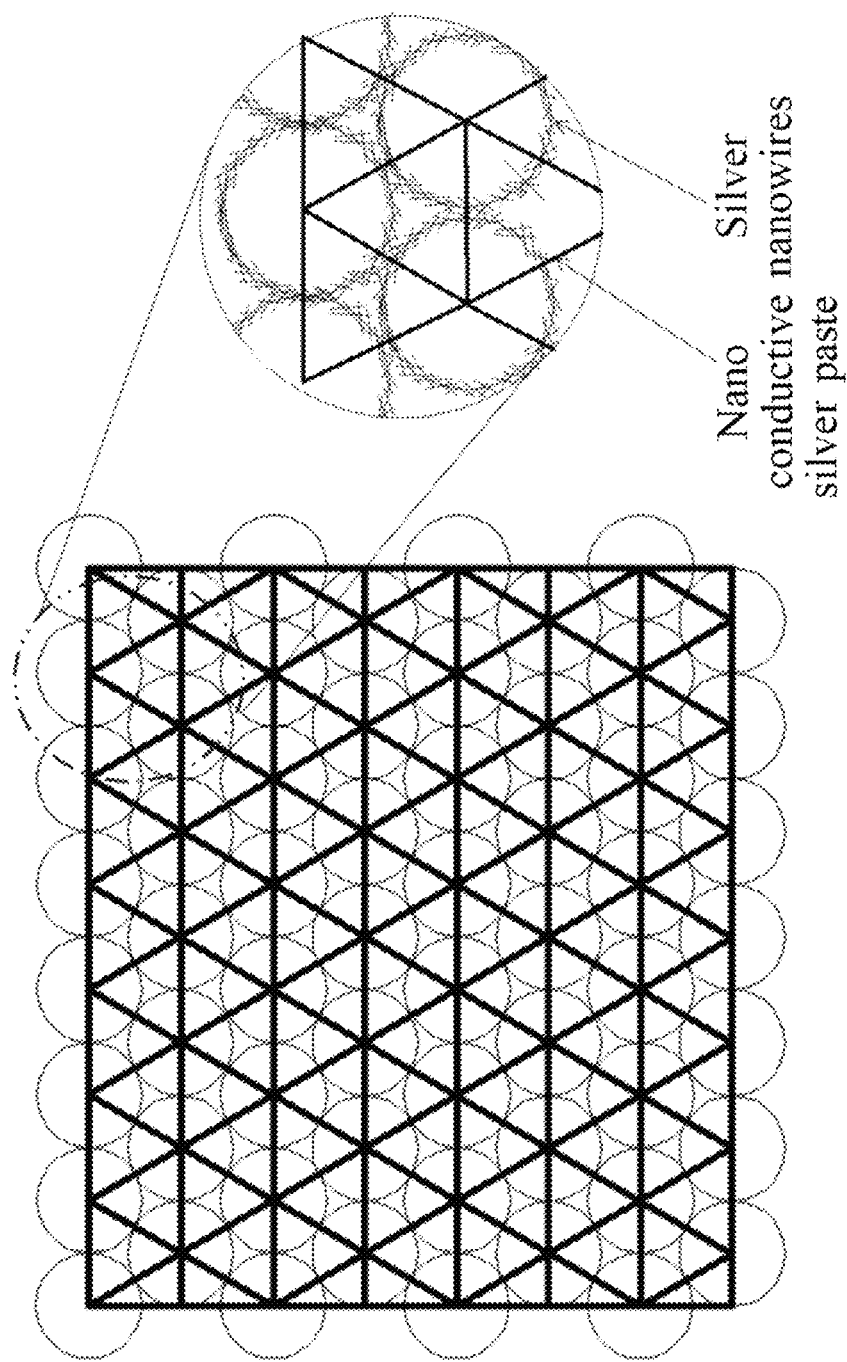
FIG. 7 is a schematic diagram of a triangular metal grid and circular metal nanowire grid composite conductive structure.

Step three, preparation of silver grids:
  the printed metal nanowire grids are moved to a printing station of the silver grids; a large-area silver grid structure is manufactured on patterns with the metal nanowire grids by utilizing electric field driven micro-nano 3D printing; the printing needle is a combined needle formed by embedding a metal needle into a capillary glass needle tube with a conical nozzle, the inner diameter of the glass needle is smaller than that of metal, and then the resolution of the printed silver grids is improved; multiple times of layer-by-layer accumulated printing is carried out according to set programs and parameters; Nano conductive silver paste (the viscosity is 40000-60000 cps, and the silver content is 60%-75%) is selected as a printing material, various (as shown in FIG. 6 and FIG. 7, square, rhombic, hexagonal, triangular and random network structures and the like) shapes of nano silver grid structures are printed by means of an electric field driven micro-nano 3D printing technology, and then large-area silver grids are manufactured; and a negative pressure pump communicating with a groove of a printing platform 502 is started, so that the printing platform and the printing base PC film are tightly adsorbed, the stability of the printing substrate is guaranteed, and the printing precision is improved, wherein the printing parameters are as follows: the inner diameter of the capillary glass needle is 20-60 μm, the distance between the spray head and the base is 60-150 μm, the printing speed is 10-20 mm/s, the direct current voltage is 800-1500 V, and the printing pressure intensity is 150-200 kpa; and the effective pattern area of the metal grids is 150 mm*150 mm, the line width is 5-10 μm, the period is 100 μm, the depth-width ratio ranges from 0.3 to 30, and the back pressure is 150-200 kpa.

Step four, conductive treatment of a silver grid and silver nanowire grid composite conductive structure:
  the printed electrode material is moved to a station of a heating curing device, and conductive treatment is carried out on the silver grid and silver nanowire grid composite conductive structure; and the temperature is set to be 120° C., and the heating time is not shorter than 50 min.

Step five, coating of photosensitive resin:
  the glue dispenser outputs the liquid photoresist to the anilox roller, and the liquid photoresist can be uniformly coated on the flexible PET substrate at a certain thickness by utilizing vertical mutual extrusion of the anilox roller and the lining roller and changing the discharging speed of the glue dispenser.

Step six, transfer of the composite conductive structure:
  the substrate containing the electrode material and the flexible transparent substrate of which the surface is coated with the photoresist enter a transfer station together at the same speed; the two supporting rollers for supporting the transfer base PET film are fixed and can move up and down at the same time; the thickness of the photoresist can be further adjusted by adjusting the two pairs of supporting rollers 501, 502; after the two substrates are attached, the ultraviolet lamp located below the two substrates is used for photoresist curing, and the irradiation time is 1.5 min; and therefore, the electrode material printed on the surface of the PDMS is embedded into the cured photosensitive resin.

Step seven, separation and film covering protection of the electrode material embedded into photoresist and the PDMS substrate:
  two flexible bases are separated in an uncovering manner after station ultraviolet curing; the electrode material is embedded into the photoresist, the photoresist is attached to the transfer base PET 405, and the two flexible bases are separated, so that the flexible transparent conductive film with an embedded electrode material is obtained; the printing base 101 is supported by supporting rollers 203, 103, 501, 502, 702, power rollers 102, 104, 105, and a tension adjusting roller 701, and is always kept in a tensioning state throughout the technological process, and printing can be repeated; the flexible transparent conductive film is moved to a protective film covering station; a layer of high-transparency protective film PET 605 with the thickness of 0.02 mm is attached to the photoresist side; and Roller surfaces 602 and 603 are attached with a layer of rubber to help the two roller surfaces fit tightly with a certain extrusion force.

Step eight: winding:

after the film covering is finished, the transparent conductive film coated with the protective film is wound under the action of the winding roller 604.

The second step to the eighth step need to be closely matched, that is, coating, printing, transferring and rolling of the printing substrate are performed at the same speed.

Wherein the printing parameters for printing the silver nannowires are as follows: the inner diameter of the capillary glass needle is 30 μm, the distance between the spray head and the base is 120 μm, the printing speed is 20 mm/s, the direct current voltage is 800 V, and the printing pressure intensity is 30 kpa. The effective pattern area of the silver nanowire grids is 150 mm*150 mm, the line width is 10 μm, and the period is 1000 μm. The printing parameters for printing the metal silver grids are as follows: the inner diameter of the capillary glass needle is 40 μm, the distance between the spray head and the base is 150 μm, the printing speed is 20 mm/s, the direct current voltage is 1000 V, and the printing pressure intensity is 170 kpa. The effective pattern area of the metal grids is 150 mm*150 mm, the line width is 10 μm, the period is 100 μm, the depth-width ratio is 15, and the back pressure is 170 kpa. Main materials used in the experiment are as follows: (1) the main performance parameters of the silver nanowires are as follows: the concentration is 90 mg/ml, the diameter is 40 nm, the length is 20 μm, and the purity is greater than 99%; and the sintering temperature is 120° C., and the sintering time is 50 min (2) the silver grid material is nano silver conductive paste, and the main performance parameters of the silver grid material are as follows: the dynamic viscosity is 350 dPas (25° C.), the silver content is about 75%, the silver particle diameter is 300-500 nm, the resistivity is 250 mΩμm, the sintering temperature is 120° C., and the sintering time is 50 min. Tests show that the light transmittance of the manufactured large-area flexible transparent conductive film can be greater than 90%, the sheet resistance is less than 0.1 SI/sq, the haze is less than 1%, the sheet resistance change rate of 100,000 times of bending is less than 5%, the surface roughness Ra is less than 10 nm, and the sheet resistance change rate is less than 5% after the film is soaked in isopropanol, deionized water and hydrochloric acid solution for 100 hours.

The foregoing descriptions are merely exemplary embodiments of the present disclosure, but are not intended to limit the present disclosure, and for the skill in the art, the present disclosure can be of various modifications and changes. Any modification, equivalent replacement, or improvement made without departing from the spirit and principle of the present disclosure shall fall within the protection scope of the present disclosure.

What is claimed is:

1. A method for manufacturing a film with an embedded metal material, comprising the steps of:

sequentially printing metal nanowire grids and metal grids with a large aspect ratio on a printing substrate using an electric field driven micro-nano 3D printing device with a printing needle, and forming a composite conductive electrode of the metal grids and the metal nanowire grids, wherein the printing needle used for electric field driven micro-nano 3D printing comprises a metal needle and an insulating tube, wherein the insulating tube sleeves the outside of the metal needle, the central axis of the metal needle and the central axis of the insulating tube are located on the same straight line, an outlet of the insulating tube is of a necking structure, and the inner diameter of the outlet of the necking structure is less than that of the metal needle; and performing conductive treatment on the composite conductive electrode to obtain an electrode material; and embedding the electrode material into a photoresist, separating the photoresist embedded with the electrode material from the printing substrate, and removing the printing substrate to obtain a conductive film, wherein the metal nanowire grids are formed by printing metal nanowires; the metal grids with a large aspect ratio are formed by printing nano metal paste, and the large aspect ratio is that the ratio range of the wire heights to the wire widths of the grid wires of the metal grids is 0.3-30.

2. The method for manufacturing a film with an embedded metal material according to claim 1, wherein during printing, the distance between the printing needle and the printing substrate is 40-200 μm, and the power supply voltage is 800-1700 V.

3. The method for manufacturing a film with an embedded metal material according to claim 1, wherein during printing, the printing substrate is fixed in a negative pressure mode.

4. The method for manufacturing a film with an embedded metal material according to claim 1, wherein the photoresist is laid on the surface of a transfer base, the electrode material on the surface of the printing substrate is immersed into the photoresist laid on the surface of the transfer base, then the photoresist is solidified, and the solidified photoresist is separated from the printing substrate; and the mode of curing the photoresist is ultraviolet irradiation curing.

5. The method for manufacturing a film with an embedded metal material according to claim 1, wherein after the printing substrate is removed, a protective film is covered on the surface of the photoresist.

\* \* \* \* \*